United States Patent
Seethamraju

(10) Patent No.: US 9,618,593 B2
(45) Date of Patent: Apr. 11, 2017

(54) PHASE ENHANCED UTE WITH IMPROVED FAT SUPPRESSION

(71) Applicant: Siemens Medical Solutions USA, Inc., Malvern, PA (US)

(72) Inventor: Ravi Teja Seethamraju, Malden, MA (US)

(73) Assignee: Siemens Healthcare GmbH, Erlangen (DE)

( * ) Notice: Subject to any disclaimer, the term of this patent is extended or adjusted under 35 U.S.C. 154(b) by 599 days.

(21) Appl. No.: 14/217,517

(22) Filed: Mar. 18, 2014

(65) Prior Publication Data

US 2015/0268316 A1     Sep. 24, 2015

(51) Int. Cl.
| | |
|---|---|
| *G01R 33/48* | (2006.01) |
| *G01R 33/50* | (2006.01) |
| *G01R 33/56* | (2006.01) |
| *G01R 33/561* | (2006.01) |

(52) U.S. Cl.
CPC .......... *G01R 33/4816* (2013.01); *G01R 33/50* (2013.01); *G01R 33/5607* (2013.01); *G01R 33/5616* (2013.01)

(58) Field of Classification Search
CPC  G01R 33/4816; G01R 33/50; G01R 33/5607; G01R 33/5616
USPC .......................... 324/307, 309, 318; 600/410
See application file for complete search history.

(56) References Cited

U.S. PATENT DOCUMENTS

2014/0296696 A1* 10/2014 Remmele ........... G01R 33/4816
                                                          600/410

OTHER PUBLICATIONS

Khoo, et al, "Comparison of MRI with CT for the radiotherapy planning of prostate cancer: a feasibility study", British Journal of Radiology, 72(1999) pp. 590-597.
Prabhakar, et al, "Feasibility of using MRI alone for 3D Radiation Treatment Planning in Brain Tumors", Jpn J Clin Oncol 2007; 27 (6) 405-411.

(Continued)

*Primary Examiner* — Melissa Koval
*Assistant Examiner* — Rishi Patel

(57) ABSTRACT

A computer-implemented method of performing magnetic resonance imaging with ultra-short echo time pulse sequences includes defining short T2 threshold limits for enhancement. A multi-echo ultra-short echo time response is acquired and a complex dataset is determined based on the multi-echo ultra-short echo time response. A plurality of phase components is identified from the complex dataset, wherein each phase component is associated with a T2 relaxation time within the short T2 threshold limits. A plurality of frequency components is also identified from the complex dataset, wherein each frequency component is associated with the T2 relaxation time within the short T2 threshold limits. Next, a magnitude dataset is derived from the complex dataset and a fitting algorithm is applied to the magnitude dataset to yield a plurality of magnitude components, wherein each magnitude component is associated with the T2 relaxation time within the short T2 threshold limits. A plurality of phase masks are created based on the plurality of phase components and the plurality of frequency components. These phase masks are applied to the magnitude dataset to obtain a combined dataset. Then, an image based on the combined dataset may be presented on a display.

20 Claims, 4 Drawing Sheets

(56) References Cited

OTHER PUBLICATIONS

Catana, et al, "Toward Implementing an MRI-Based PET Attenuation-Correction Method for Neurologic Studies on the MR-PET Brain Prototype", J Nucl Med 2010; 51:1431-1438.

Martinez-Moller, et al, "Tissue Classification as a Potential Approach for Attenuation Correction in Whole-Body PET/MRI: Evaluation with PET/CT Data", J Nucl Med 2009; 50:20-526.

Seethamraju, et al, "Experiences With UTE Imaging After Administration of Feraheme in a Clinical Setting", Proceedings of RSNA 2011; SSE13-05.

Du, et al, "Qualitative and quantitative ultrashort echo time (UTE) imagining of cortical bone", Journal of Magnetic Resonance 207 (2010) 304-311.

Franke, et al, "UTILE—A fast combined UTE-DIXON four class attenuation correction technique for PET/MR", Proc. Intl. Soc. Mag. Reson. Med. 19 (2011).

Nehrke, et al, "DREAM—A Novel Approach for Robust, Ultrafast, Multislice B1 Mapping", Magnetic Resonance in Medicine, Online Jan. 17, 2012.

Haacke, et al, "Susceptibility-Weighted Imaging: Technical Aspects and Clinical Applications, Part 1", AJNR Am J Neuroradiol 30:Jan. 19-30, 2009.

Mittal, et al, "Susceptibility-Weighted Imaging: Technical Aspects and Clinical Applications, Part 2", AJNR Am J Neuroradiol 30:232-52, Feb. 2009.

Carl et al, "Investigations of the Origin of Phase Differences Seen with Ultrashort TE Imaging of Short T2 Meniscal Tissue", Magnetic Resonance in Medicine 67:991-1003 (2012).

* cited by examiner

PHASE ENHANCED UTE WITH IMPROVED FAT SUPPRESSION

TECHNICAL FIELD

The present invention relates generally to methods, systems, and apparatuses for applying phase enhanced processing for ultrashort echo time (UTE) magnetic resonance pulse sequences to improve fat suppression. The disclosed methods, systems, and apparatuses may be applied to, for example, to enhance the presentation and segmentation of bones in magnetic resonance images.

BACKGROUND

Computed Tomography (CT) is an imaging method that uses x-rays to create pictures of cross-sections of the body. Traditionally, CT has provided benefits over other imaging modalities with respect to the presentation of major structural and supportive connective tissue of the body such as osseous (i.e., bone) tissue. However, a major drawback of CT imaging is that it requires harmful radiation to be applied to the patient during the imaging scan. Accordingly, there is a need to use other imaging modalities to provide high quality images of a structural and supportive connective tissue without the use of harmful radiation.

Magnetic Resonance Imaging (MRI) offers a non-invasive imaging modality as an alternative to CT. However, traditionally, MRI has not been used in clinical applications to image structural and supportive connective tissue, as well as other solid materials, due to the related very short T2/T2* relaxation times associated with these materials. For example, many solid anatomical materials have relaxation times on the order of 100 microseconds. This short relaxation time results in a small magnetic resonance signal which, in turn, causes these materials to appear dark in images.

Recently, MRI applications have been developed to detect signals with short T2s using ultrashort echo time (UTE) pulse sequences. UTE pulse sequences typically have very short TEs in the order of 50 microseconds. Thus, these sequences provide the opportunity of capturing the signal from hard materials. However, accurate presentation and segmentation of structural and supportive connective tissue also requires the suppression of signals like fat that can occlude the signals from these hard materials. Traditional fat suppression has been challenging when used with UTE applications as it tends to attenuate the weak signal from the hard materials Therefore, there is a need for an MRI imaging technique that utilizes UTE imaging to acquire signals from hard materials, while also providing enhanced fat suppression to make the presentation of structural and supportive connective tissue comparable to that available from CT imaging techniques.

SUMMARY

Embodiments of the present invention address and overcome one or more of the above shortcomings and drawbacks, by providing methods, systems, and apparatuses for performing phase enhanced ultrashort echo time (UTE) imaging with suppression of long T2 components. This technology is particularly well-suited for, but by no means limited to, using Magnetic Resonance Imaging (MRI) to present and segment images of bone tissue.

According to some embodiments of the present invention, a computer-implemented method of performing magnetic resonance imaging with ultra-short echo time pulse sequences includes defining short T2 threshold limits for enhancement, for example, based on user input. A multi-echo ultra-short echo time response is acquired and a complex dataset is determined based on the multi-echo ultra-short echo time response. Based on the complex dataset, phase components and frequency components are identified. Each phase component is associated with a T2 relaxation time within the short T2 threshold limits, while each frequency component is associated with the T2 relaxation time within the short T2 threshold limits. Next, a magnitude dataset is derived from the complex dataset and a fitting algorithm (e.g., a biexponential signal decay fitting algorithm) is applied to the magnitude dataset to yield a plurality of magnitude components, wherein each magnitude component is associated with the T2 relaxation time within the short T2 threshold limits. A plurality of phase masks are created based on the plurality of phase components and the plurality of frequency components. These phase masks are applied to the magnitude dataset to obtain a combined dataset, for example, by multiplying the phase masks by the magnitude data set for a predetermined number of times. Then, an image based on the combined dataset may be presented on a display.

Various enhancements, additions, and/or modifications may be made the aforementioned method. For example, in one embodiment, a user-selected anatomical area of interest (e.g., bone, marrow, or cartilage) is identified based on user input. Then, an empirical T2 relaxation time associated with the user-selected anatomical area of interest is determined and may be used in defining the short T2 threshold limits. In other embodiments, the phase components are identified in the aforementioned method by first identifying a first and second signal in the multi-echo ultra-short echo time response. The first signal corresponds to a first echo in the multi-echo ultra-short echo time response and the second signal corresponds to a later echo in the multi-echo ultra-short echo time response, the later echo following the first echo in the multi-echo ultra-short echo time response. In one embodiment, the later echo immediately follows the first echo in the multi-echo ultra-short echo time response. Next, a predetermined weighting value is applied to the second signal, yielding a weighted second signal. The weighted second signal may then be subtracted from the first signal to identify the plurality of phase components.

According to other embodiments of the present invention, a method for performing phase enhanced UTE with improved fat suppression includes applying a multi-echo gradient echo sequence comprising a first echo set to an ultra-short echo time to an anatomic area of interest and obtaining a complex data set in response to application of the multi-echo gradient echo sequence. Next, a magnitude data set based on the complex data set and a fitting algorithm is applied to the magnitude data set to obtain a T2* map. Two phase masks may then be created based on this map. The first phase mask is based on a first portion of the T2* map comprising first components of the magnitude data set associated with a first echo in the multi-echo gradient echo sequence. The second phase mask is based on a second portion of the T2* map comprising second components of the magnitude data set associated with a second echo in the multi-echo gradient echo sequence. A suppression mask is determined based on a remaining portion of the T2* map which excludes the first portion and the second portion. This suppression mask is applied to the T2* map to remove one or more magnitude values from the T2* map, yielding a filtered T2* map. The filtered T2* map is then multiplied one or more times by a weighted combination of the first phase mask and the second phase mask to yield an enhanced image data set. An image may then be presented on a display based on the enhanced image data set.

In some embodiments, the aforementioned method also includes selecting a first species of anatomy for image enhancement and selecting a second species of anatomy for image suppression. For example, in one embodiment, the first species of anatomy includes one or more of bone, marrow, or cartilage and the second species is fat. The second species of anatomy may be selected automatically based on selection of the first species of anatomy. Once these species are determined they may be used in selecting settings used in performing the aforementioned method. For example, in one embodiment, the ultra-short echo time for the first echo set is determined based on the first species of anatomy.

According to other embodiments, a system for performing magnetic resonance imaging with ultra-short echo time pulse sequences comprises a magnetic resonance imaging device and an image data processor. The magnetic resonance imaging device is configured to apply a multi-echo gradient echo sequence to an anatomic area of interest, and acquire a multi-echo ultra-short echo time response. The imaging data processor is configured to process the response based on one or more defined short T2 threshold limits. Specifically, the imaging data processor is configured to determine a complex dataset based on the multi-echo ultra-short echo time response and identify phase components from the complex dataset that are associated with a T2 relaxation time within the short T2 threshold limits. The image data processor is further configured to derive a magnitude dataset based on the complex dataset, and apply a fitting algorithm to the magnitude dataset to identify magnitude components associated with the T2 relaxation time within the short T2 threshold limits The image data processor creates a phase mask based on the phase components which is then applied by the processor to the magnitude dataset to obtain a combined dataset. In some embodiments, there may be additional components of the system. For example, in one embodiment, the system also includes a display configured to present an image based on the combined dataset. In one embodiment, the system includes a user input device configured to select a species of anatomy for image enhancement which may then be used to define the short T2 threshold limits.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

The following disclosure describes the present invention according to several embodiments directed at methods, systems, and apparatuses for performing phase enhanced ultrashort echo time (UTE) imaging with saturation of long T2 components. These techniques may be used, for example, to create images which enhance bones in an MRI scan while suppressing fat, thus improving segmentation of the bones over conventional techniques.

Figure 1:
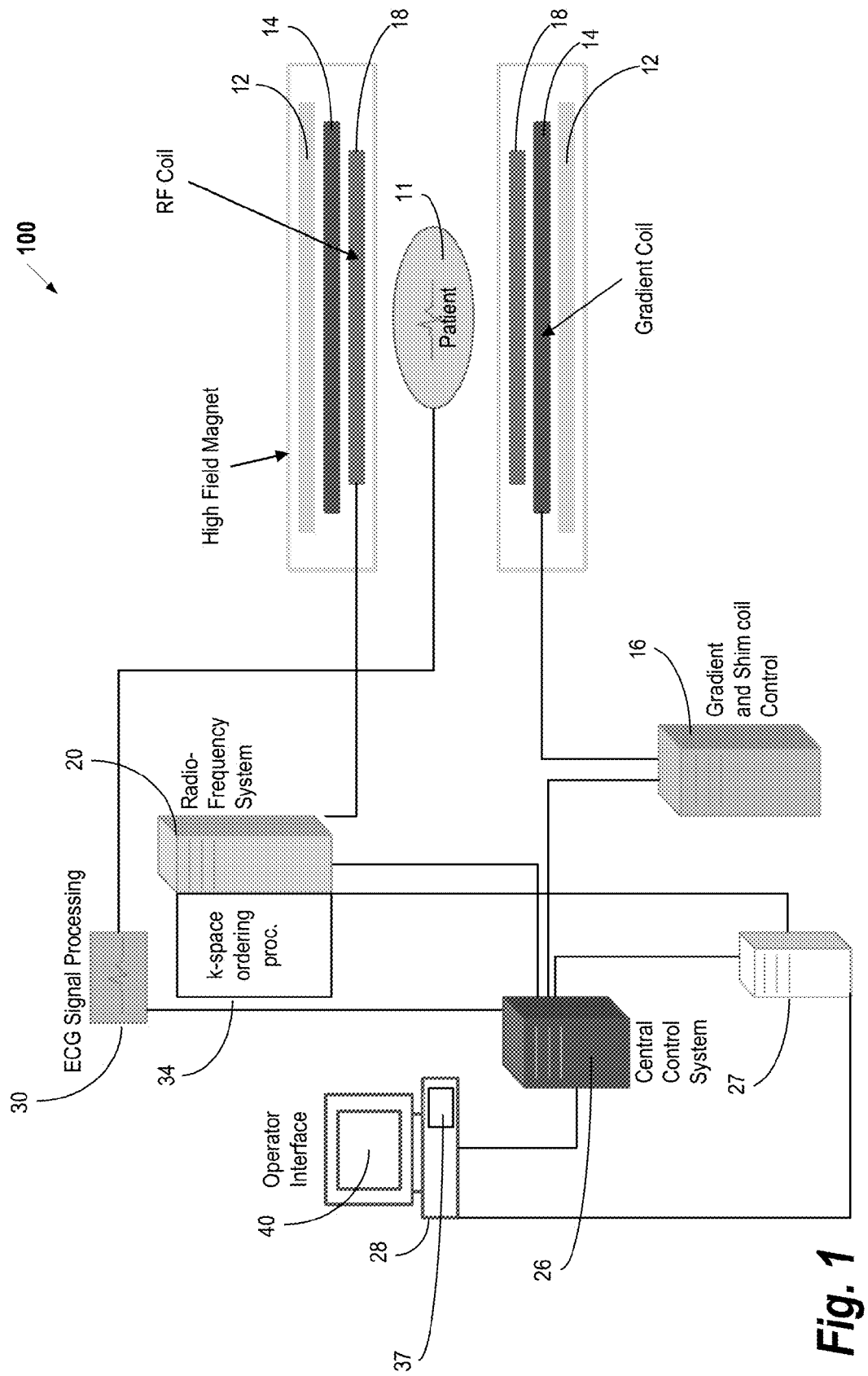
FIG. 1 shows a system for ordering acquisition of frequency domain components representing MR image data for storage in a k-space storage array, as used in some embodiments of the present invention.

FIG. 1 shows a system 100 for ordering acquisition of frequency domain components representing MR image data for storage in a k-space storage array, as used by some embodiments of the present invention. In system 100, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and Shim Coil Control module 16 in conjunction with RF module 20 as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide image representative data to an image data processor. In some embodiments, the image data processor is located in central control unit 26, while in other embodiments such as the one depicted in FIG. 1, the image data processor is located in a separate unit 27. ECG synchronization signal generator 30 provides ECG signals used for pulse sequence and imaging synchronization. A two or three dimensional k-space storage array of individual data elements in unit 34 stores corresponding individual frequency components comprising an MR dataset. The k-space array of individual data elements has a designated center and individual data elements individually have a radius to the designated center;

A magnetic field generator (comprising magnetic coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected MR signals in a coordinated manner to generate high quality images of a selected slice (or slices) of the body and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central controller 26 and enables user modification of magnetic resonance imaging signals in substantially real time. Display processor 37 processes the magnetic resonance signals to provide image representative data for display on display 40, for example.

Figure 2:
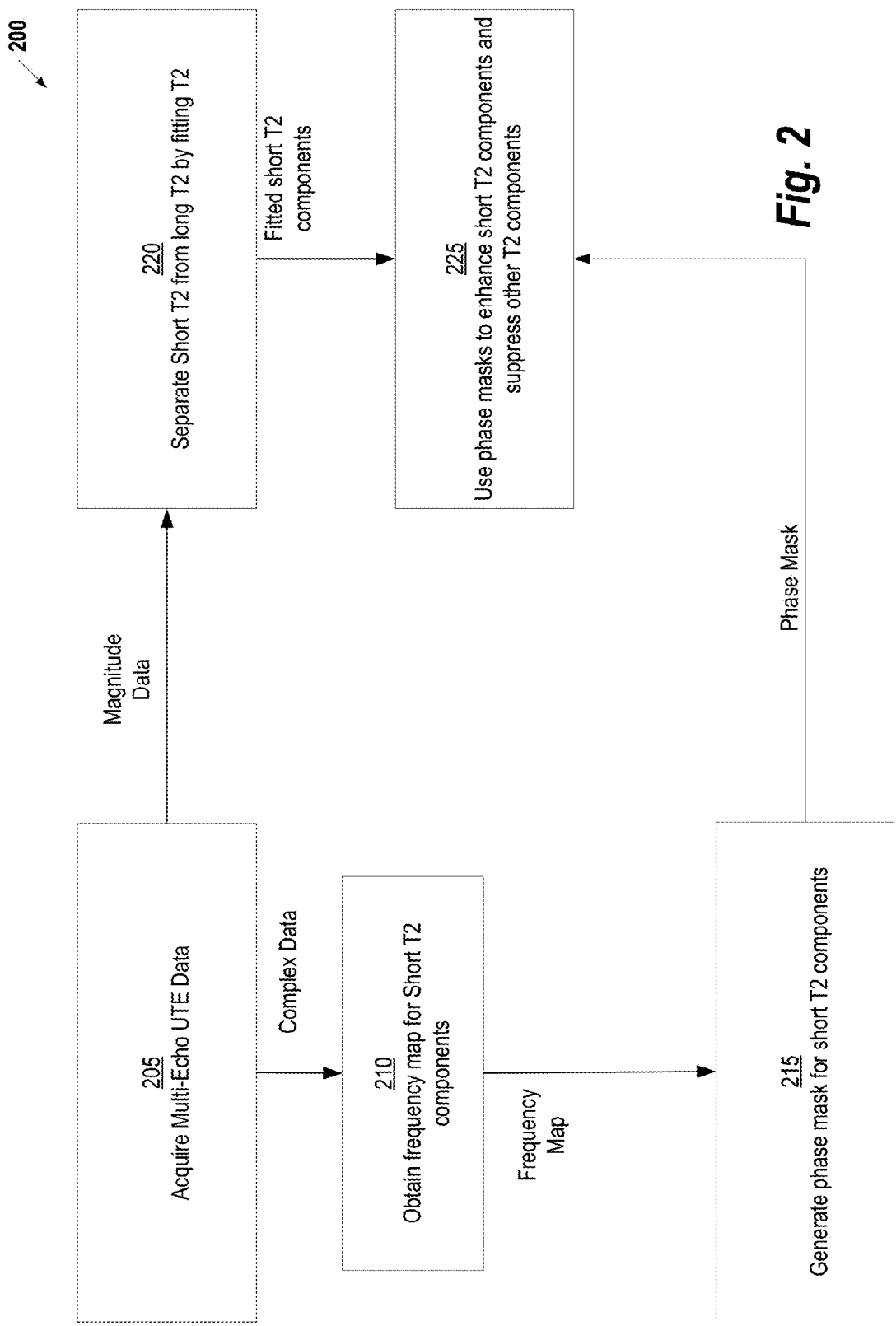
FIG. 2 provides a high-level overview of a method for performing phase enhanced UTE, according to some embodiments of the present invention.

FIG. 2 provides a high-level overview of a method 200 for performing phase enhanced UTE, according to some embodiments of the present invention. As is understood in the art, imaging of short-T2 species requires two changes to conventional signal acquisition techniques. First, any pulse sequences used must have a short echo time. Secondly, there must be efficient suppression of long-T2 species in order to maximize the short-T2 contrast and dynamic range. The method illustrated in FIG. 2 addresses these requirements by utilizing UTE pulse sequences and phase-based identification of short T2 components, as discussed in further detail below.

Returning to FIG. 2, at 205, a multi-echo UTE pulse sequence is applied to the anatomical area of interest and complex data samples are acquired in response. This sequence may be applied, for example, using the system 100 illustrated in FIG. 1. At 210, the complex data samples are used to obtain phase data samples and frequency map of the phase data samples associated with short T2 data. More specifically, the map is generated by applying a thresholding to the phase data samples such that phase data samples outside these threshold values are suppressed. The exact value of this predetermined thresholds may be set, for example, based on empirical data regarding the anatomical area of interest that is being targeted for imaging. After the frequency map is generated, it is used at 215 to generate a phase mask that is generated from the phase data samples associated with short T2 values.

Continuing with reference to FIG. 2, the complex data samples acquired at 205 is used to derive magnitude data for the acquired signal. Next, at 220, the short T2 components are separated from the long T2 components by applying a data fitting algorithm to the magnitude data. In some embodiments, the data fitting algorithm is a biexponential signal decay fitting algorithm which utilizes a multivariate constrained nonlinear optimization method. In other embodiments, different data fitting algorithms may be used. At 225, once the fitted short T2 components are identified, signals outside this range are suppressed and the phase mask generated at 215 is used to enhance the fitted short T2 components. The enhanced fitted short T2 components may then be presented in an image, thus providing clinicians with a view of an anatomical area of interest where anatomy associated with long T2 values (e.g., fat) is suppressed.

Figure 3:
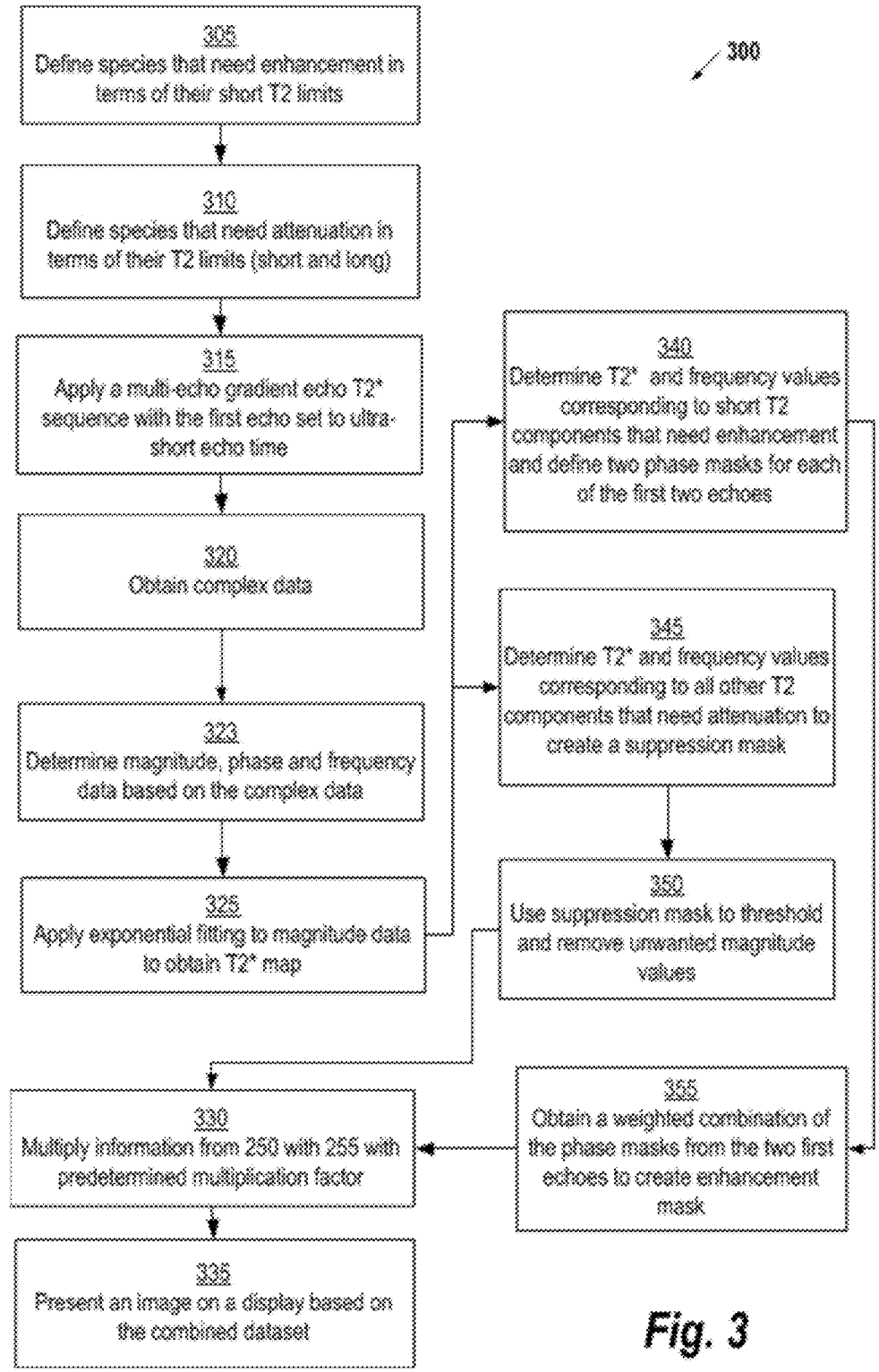
FIG. 3 provides a detailed overview of a method for performing phase enhanced UTE with improved fat suppression, according to some embodiments of the present invention.

FIG. 3 provides a detailed overview of a method 300 for performing phase enhanced UTE with improved fat suppression, according to some embodiments of the present invention. The process begins by determining the species that are desired to be enhanced or attenuated in the resulting image. At 305, a first species of anatomy is defined as requiring enhancement in terms of its short T2 limits. The definition provided at 305 could be based on one or more predefined clinical settings or, alternatively, based on user selection of a species or set of species at a terminal Then, at 310, one or more second species is defined as requiring attenuation in terms of its T2 limits (short and long). Again, this second species can be defined using clinical settings or user input. Alternatively, in some embodiments, the second species is defined based on a relationship to the first species. For example, in one embodiment, the first species is defined to be bone, marrow, and/or cartilage. Then, fat is automatically defined as the second species.

Continuing with reference to FIG. 3, at 315, a multi-echo gradient echo T2* sequence is applied to the anatomic area of interest, for example, using the system 100 illustrated in FIG. 1. As is understood in the art, T2* decay is generally faster than T2 decay because it includes both the effects of T2 decay as well as dephasing due to magnetic inhomogeneities (e.g., areas of the magnetic field that do not match the external magnetic field strength). To measure this rapid decay, the multi-echo gradient echo T2* sequence is designed such that the first set of echoes are set to an ultra-short echo time. For example, in one embodiment, the TE for the first echoes are set to a value selected between 50 to 200 microseconds. The exact range of values used may depend on the species identified at 305 and 310. For example, the TE of the first set of echoes may be selected such that the species identified at 305 are enhanced.

In response to the multi-echo gradient echo sequence applied at 315, complex data is obtained at 320. This complex data is used at 323 to derive magnitude, phase, and frequency data. Then, at 325, a bi-exponential fitting algorithm is applied to magnitude data to obtain a T2* map. As is understood in the art, the term T2* map refers to a parametric image of an anatomical area of interest where the image intensity is proportional to the T2* values of the nuclei in the area. Next, at 340, phase masks are generated to enhance the species defined in 305. First, the T2* and frequency values corresponding to T2 components that need enhancement ("short T2 components") are determined. In one embodiment, this done by weighted subtraction based on echo correspondence. For example, T2* map data acquired from the first two echoes may be subtracted from data acquired from the later echoes such that only a portion of the map corresponding to the short T2 components remain. In some embodiments, the data from the later echoes are weighted, for example, using empirically determined weighting values. A similar technique may be applied to the frequency data. The identified portions of the T2* map and frequency are then used to define two phase masks corresponding to the first two echoes. Any technique known in the art may be used to construct the phase mask from the short T2 components. These masks enhance pixels of interest corresponding to short T2 components and suppress pixels of other phase values. Although two echoes are used at 340 to generate the masks, it should be understood that additional echoes from the sequence may be used to generate masks. Alternatively, in some embodiments, only one echo is used at 340 to generate a single phase mask.

Following creation of the phase masks, at 345, a suppression mask is created to attenuate all other T2 components of the T2* map and the frequency data. In some embodiments, the T2 limits of the species defined at 310 are used to attenuate a specific subset of the T2 components, rather than all the remaining T2 components, for example signal from blood may be retained. Then, at 350 the suppression mask is used to threshold and remove unwanted magnitude values from the T2* map, thus creating a filtered T2* map. Next, at 355, a weighted combination of the phase masks obtained at 340 is used to create an enhancement mask. The values of the weights applied to create the enhancement mask may be set dependent on the clinical application. For example, to enhance very short T2* components the phase mask associated with the first echo may be weighted with a higher value than the phase mask associated with the second echo. In other embodiments, where the response from both echoes is equally important, identical (or nearly identical) weighting values may be applied to combine the phase masks and create the enhancement masks. It should be noted that in embodiments where only a single phase mask is created based on the first echo, the enhancement mask is equivalent to the phase mask.

Returning to FIG. 3, at 330, the filtered T2* map created at 350 is multiplied by the enhancement map created at 355 to yield an enhanced data set. In some embodiments, the multiplication further includes a predetermined multiplication factor selected to provide additional weighting to the enhancement map. Finally, at 335 an image may be generated based on the enhanced data set and presented on a display or saved to a data store for later review and processing.

Figure 4:
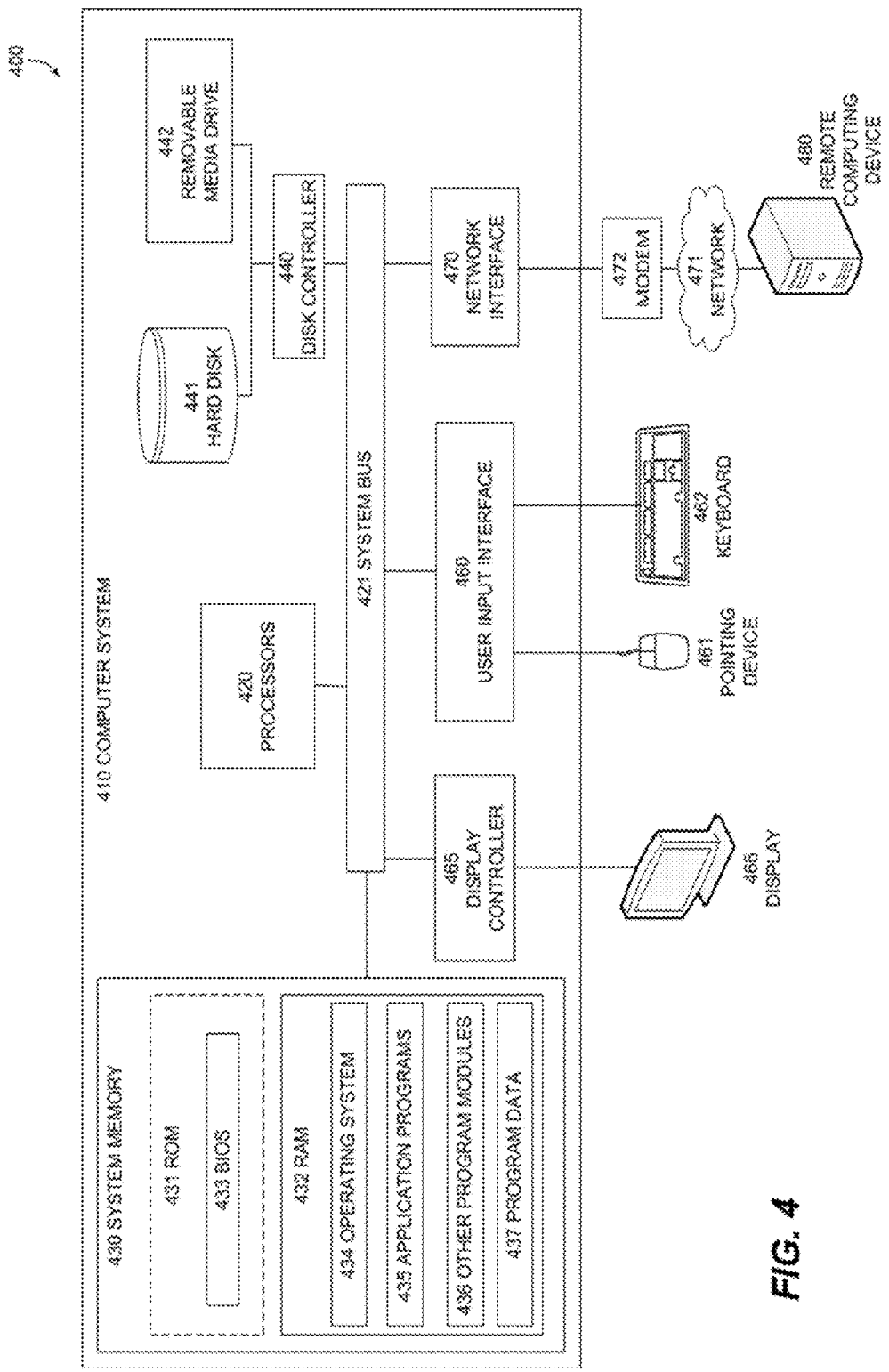
FIG. 4 illustrates an exemplary computing environment within which embodiments of the invention may be implemented.

FIG. 4 illustrates an exemplary computing environment 400 within which embodiments of the invention may be implemented. For example, computing environment 400 may be used to implement one or more components of system 100 shown in FIG. 1. Computers and computing environments, such as computer system 410 and computing environment 400, are known to those of skill in the art and thus are described briefly here.

As shown in FIG. 4, the computer system 410 may include a communication mechanism such as a system bus 421 or other communication mechanism for communicating information within the computer system 410. The computer system 410 further includes one or more processors 420 coupled with the bus 421 for processing the information.

The processors 420 may include one or more central processing units (CPUs), graphical processing units (GPUs), or any other processor known in the art. More generally, a processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

Continuing with reference to FIG. 4, the computer system 410 also includes a system memory 430 coupled to the system bus 421 for storing information and instructions to be executed by processors 420. The system memory 430 may include computer readable storage media in the form of volatile and/or nonvolatile memory, such as read only memory (ROM) 431 and/or random access memory (RAM) 432. The system memory RAM 432 may include other dynamic storage device(s) (e.g., dynamic RAM, static RAM, and synchronous DRAM). The system memory ROM 431 may include other static storage device(s) (e.g., programmable ROM, erasable PROM, and electrically erasable PROM). In addition, the system memory 430 may be used for storing temporary variables or other intermediate information during the execution of instructions by the processors 420. A basic input/output system 433 (BIOS) containing the basic routines that help to transfer information between elements within computer system 410, such as during start-up, may be stored in ROM 431. RAM 432 may contain data and/or program modules that are immediately accessible to and/or presently being operated on by the processors 420. System memory 430 may additionally include, for example, operating system 434, application programs 435, other program modules 436 and program data 437.

The computer system 410 also includes a disk controller 440 coupled to the system bus 421 to control one or more storage devices for storing information and instructions, such as a magnetic hard disk 441 and a removable media drive 442 (e.g., floppy disk drive, compact disc drive, tape drive, and/or solid state drive). The storage devices may be added to the computer system 410 using an appropriate device interface (e.g., a small computer system interface (SCSI), integrated device electronics (IDE), Universal Serial Bus (USB), or FireWire).

The computer system 410 may also include a display controller 465 coupled to the bus 421 to control a display or monitor 465, such as a cathode ray tube (CRT) or liquid crystal display (LCD), for displaying information to a computer user. The computer system includes an input interface 460 and one or more input devices, such as a keyboard 462 and a pointing device 461, for interacting with a computer user and providing information to the processor 420. The pointing device 461, for example, may be a mouse, a light pen, a trackball, or a pointing stick for communicating direction information and command selections to the processor 420 and for controlling cursor movement on the display 466. The display 466 may provide a touch screen interface which allows input to supplement or replace the communication of direction information and command selections by the pointing device 461.

The computer system 410 may perform a portion or all of the processing steps of embodiments of the invention in response to the processors 420 executing one or more sequences of one or more instructions contained in a memory, such as the system memory 430. Such instructions may be read into the system memory 430 from another computer readable medium, such as a hard disk 441 or a removable media drive 442. The hard disk 441 may contain one or more datastores and data files used by embodiments of the present invention. Datastore contents and data files may be encrypted to improve security. The processors 420 may also be employed in a multi-processing arrangement to execute the one or more sequences of instructions contained in system memory 430. In alternative embodiments, hard-wired circuitry may be used in place of or in combination with software instructions. Thus, embodiments are not limited to any specific combination of hardware circuitry and software.

As stated above, the computer system 410 may include at least one computer readable medium or memory for holding instructions programmed according embodiments of the invention and for containing data structures, tables, records, or other data described herein. The term "computer readable medium" as used herein refers to any medium that participates in providing instructions to the processor 420 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as hard disk 441 or removable media drive 442. Non-limiting examples of volatile media include dynamic memory, such as system memory 430. Non-limiting examples of transmission media include coaxial cables, copper wire, and fiber optics, including the wires that make up the system bus 421. Transmission media may also take the form of acoustic or light waves, such as those generated during radio wave and infrared data communications.

The computing environment 400 may further include the computer system 420 operating in a networked environment using logical connections to one or more remote computers, such as remote computer 480. Remote computer 480 may be a personal computer (laptop or desktop), a mobile device, a server, a router, a network PC, a peer device or other common network node, and typically includes many or all of the elements described above relative to computer system 410. When used in a networking environment, computer 410 may include modem 472 for establishing communications over a network 471, such as the Internet. Modem 472 may be connected to system bus 421 via user network interface 470, or via another appropriate mechanism.

Network 471 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 410 and other computers (e.g., remote computing system 480). The network 471 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 471.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the UI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

I claim:

1. A computer-implemented method of performing magnetic resonance imaging with ultra-short echo time pulse sequences, the method comprising:
   defining short T2 threshold limits for enhancement;
   acquiring a multi-echo ultra-short echo time response;
   determining a complex dataset based on the multi-echo ultra-short echo time response;
   identifying a plurality of phase components from the complex dataset, wherein each phase component is associated with a T2 relaxation time within the short T2 threshold limits;

identifying a plurality of frequency components from the complex dataset, wherein each frequency component is associated with the T2 relaxation time within the short T2 threshold limits;

deriving a magnitude dataset from the complex dataset;

applying a fitting algorithm to the magnitude dataset to yield a plurality of magnitude components, wherein each magnitude component is associated with the T2 relaxation time within the short T2 threshold limits;

creating a plurality of phase masks based on the plurality of phase components and the plurality of frequency components;

applying the plurality of phase masks to the magnitude dataset to obtain a combined dataset; and presenting an image on a display based on the combined dataset.

2. The method of claim 1, wherein the short T2 threshold limits are defined based on user input.

3. The method of claim 2, wherein the method further comprises:
identifying a user-selected anatomical area of interest based on user input;
determining an empirical T2 relaxation time associated with the user-selected anatomical area of interest,
wherein the short T2 threshold limits are defined based on the empirical T2 relaxation time.

4. The method of claim 3, wherein the user-selected anatomical area of interest includes one or more of bone, marrow, or cartilage.

5. The method of claim 1, wherein the plurality of phase components are identified from the complex dataset according to a process comprising:
identifying a first signal from a first echo in the multi-echo ultra-short echo time response;
identifying a second signal from a later echo in the multi-echo ultra-short echo time response, the later echo following the first echo in the multi-echo ultra-short echo time response;
applying a predetermined weighting value to the second signal, yielding a weighted second signal and
subtracting the weighted second signal from the first signal to identify the plurality of phase components.

6. The method of claim 5, wherein the later echo immediately follows the first echo in the multi-echo ultra-short echo time response.

7. The method of claim 1, wherein the fitting algorithm is a biexponential signal decay fitting algorithm utilizing a multivariate constrained nonlinear optimization method.

8. The method of claim 1, wherein applying the plurality of phase masks to the magnitude dataset to obtain the combined dataset comprises:
determining a number of preferred multiplications; and
multiplying the plurality of phase masks by the magnitude dataset for the number of preferred multiplications to yield the combined dataset.

9. A method for performing phase enhanced UTE with improved fat suppression, the method comprising:
applying a multi-echo gradient echo sequence comprising a first echo set to an ultra-short echo time to an anatomic area of interest;
obtaining a complex data set in response to application of the multi-echo gradient echo sequence;
determining a magnitude data set based on the complex data set;
applying a fitting algorithm to the magnitude data set to obtain a T2* map;

creating a first phase mask based on a first portion of the T2* map comprising first components of the magnitude data set associated with a first echo in the multi-echo gradient echo sequence;

creating a second phase mask based a second portion of the T2* map comprising second components of the magnitude data set associated with a second echo in the multi-echo gradient echo sequence;

determining a suppression mask based on a remaining portion the T2* map which excludes the first portion and the second portion;

applying the suppression mask to the T2* map to remove one or more magnitude values from the T2* map, yielding a filtered T2* map;

determining a weighted combination of the first phase mask and the second phase mask; and multiplying the filtered T2* map by the weighted combination of the first phase mask and the second phase mask to yield an enhanced image data set.

10. The method of claim 9, further comprising:
selecting a first species of anatomy for image enhancement; and
selecting a second species of anatomy for image suppression.

11. The method of claim 10, further comprising:
determining the ultra-short echo time for the first echo set based on the first species of anatomy.

12. The method of claim 10, wherein the first species of anatomy includes one or more of bone, marrow, or cartilage.

13. The method of claim 10, wherein the second species of anatomy is selected automatically based on selection of the first species of anatomy.

14. The method of claim 10, wherein the second species of anatomy comprises fat.

15. The method of claim 9, further comprising:
presenting an image on a display based on the enhanced image data set.

16. The method of claim 9, wherein the fitting algorithm is a bi-exponential signal decay fitting algorithm utilizing a multivariate constrained nonlinear optimization method.

17. The method of claim 9, wherein multiplying the filtered T2* map by the weighted combination of the first phase mask and the second phase mask to yield the enhanced image data set comprises:
determining a number of preferred multiplications; and
multiplying the filtered T2* map by the weighted combination of the first phase mask and the second phase mask for the number of preferred multiplications to yield the enhanced image data set.

18. A system for performing magnetic resonance imaging with ultra-short echo time pulse sequences, the system comprising:
a magnetic resonance imaging device configured to:
apply a multi-echo gradient echo sequence to an anatomic area of interest, and
acquire a multi-echo ultra-short echo time response following application of the multi-echo gradient echo sequence to an anatomic area; and
an image data processor configured to:
define one or more short T2 threshold limits,
determine a complex dataset based on the multi-echo ultra-short echo time response,
identify a plurality of phase components from the complex dataset, wherein each phase component is associated with a T2 relaxation time within the short T2 threshold limits, create a phase mask based on the plurality of phase components, derive a magnitude dataset based on the complex dataset, apply a fitting algorithm to the magnitude dataset to yield a plurality of magnitude components, wherein each magnitude component is associated with the T2 relaxation time within the short T2 threshold limits, and apply the phase mask to the magnitude dataset to obtain a combined dataset.

19. The system of claim 18, further comprising:
display configured to present an image based on the combined dataset.

20. The system of claim 18, further comprising:
a user input device configured to select a species of anatomy for image enhancement, wherein the short T2 threshold limits are defined based on the species.

* * * * *